United States Patent
Heiss et al.

(10) Patent No.: US 11,963,466 B2
(45) Date of Patent: Apr. 16, 2024

(54) SWITCH DEVICE AND METHOD FOR MANUFACTURING A SWITCH DEVICE

(71) Applicant: Infineon Technologies AG, Neubiberg (DE)

(72) Inventors: Dominik Heiss, Munich (DE); Christoph Kadow, Gauting (DE); Matthias Markert, Weinböhla (DE)

(73) Assignee: Infineon Technologies AG, Neubiberg (DE)

( * ) Notice: Subject to any disclaimer, the term of this patent is extended or adjusted under 35 U.S.C. 154(b) by 247 days.

(21) Appl. No.: 17/330,610

(22) Filed: May 26, 2021

(65) Prior Publication Data

US 2021/0376234 A1    Dec. 2, 2021

(30) Foreign Application Priority Data

May 27, 2020   (EP) .................... 20176725

(51) Int. Cl.
*H10N 70/20*   (2023.01)
*H10N 70/00*   (2023.01)

(52) U.S. Cl.
CPC ......... *H10N 70/253* (2023.02); *H10N 70/066* (2023.02); *H10N 70/823* (2023.02); *H10N 70/8265* (2023.02); *H10N 70/8613* (2023.02); *H10N 70/231* (2023.02); *H10N 70/8616* (2023.02); *H10N 70/8828* (2023.02)

(58) Field of Classification Search
CPC .. H10N 70/253; H10N 70/066; H10N 70/823; H10N 70/8265; H10N 70/8613; H10N 70/231; H10N 70/8616; H10N 70/8828; H10N 70/821; H10B 63/10; H10B 63/80
See application file for complete search history.

(56) References Cited

U.S. PATENT DOCUMENTS

| | | | |
|---|---|---|---|
| 6,815,704 B1 * | 11/2004 | Chen | H10N 70/8413 257/296 |
| 7,800,092 B2 * | 9/2010 | Liu | H10N 70/253 257/E47.001 |
| 9,117,748 B2 * | 8/2015 | Schulze | H01L 29/7393 |
| 2008/0029753 A1 | 2/2008 | Xu et al. | |
| 2014/0264230 A1 | 9/2014 | Borodulin et al. | |

FOREIGN PATENT DOCUMENTS

| | | |
|---|---|---|
| WO | 2009001262 A1 | 12/2008 |
| WO | 2009130668 A1 | 10/2009 |

OTHER PUBLICATIONS

Young, Robert M., et al., "Improvements in GeTe-based phase change RF switches", 2018 IEEE/Mtt-S International Microwave Symposium, Jun. 2018, pp. 832-835.

* cited by examiner

*Primary Examiner* — Allison Bernstein
(74) *Attorney, Agent, or Firm* — Murphy, Bilak & Homiller, PLLC (57) ABSTRACT

A switch device including a semiconductor substrate is provided. A trench is formed in the substrate, and a phase change material is provided at least partially in the trench. A heater for heating the phase change material is also provided.

21 Claims, 8 Drawing Sheets

SWITCH DEVICE AND METHOD FOR MANUFACTURING A SWITCH DEVICE

TECHNICAL FIELD

The present application relates to switch devices and methods for manufacturing and operating such switch devices.

BACKGROUND

The technical requirements for radio frequency applications (RF applications) using high frequencies, such as radar sensing and mobile communication according to the 5G standard, are increasing. In particular, switches having improved characteristics compared to state of the art CMOS switches will be required to meet future demands. Phase change switches are considered as promising candidates for switching RF signals. Such phase change switches use a phase change material (PCM) which typically exhibits a higher electric conductivity in a crystalline phase state than in an amorphous phase state. By changing the phase state of the phase change material, a switching device including such a material may be switched on or off.

For example, to change the phase state from amorphous to crystalline, typically a heater is employed heating the phase change material causing crystallization. This switching on is also referred to as a set operation of the switching device. In this set operation, the heater is actuated in such a way that the temperature of the phase change material is above its crystallization temperature, typically about 350° C., but below the melt temperature of typically in a range of 600° C. to 900° C., for example. The length of the heating pulse caused by the heater is chosen such that any amorphous region present in the PCM can regrow into the crystalline phase state.

When switching off the switching device, also referred to as reset operation, the heater is actuated in such a way that the temperature of the PCM is raised above the melt temperature (e.g. above about 600° C. to 900° C.), followed by rapid cooldown which freezes the phase change material into an amorphous state.

Heating the phase change material causes energy losses when also other adjacent components and structures are heated. Furthermore, for the rapid cooldown, a corresponding thermal coupling to a heat sink is required.

SUMMARY

A switching device as defined in claim 1 and a method as defined in claim 14 are provided. The dependent claims define further embodiments.

According to an embodiment, a switch device is provided, comprising: a substrate, a trench formed in the substrate, a phase change material disposed at least partially in the trench, and a heater configured to heat the phase change material.

According to another embodiment, a method for manufacturing a switch device is provided, comprising: providing a substrate, forming a trench in the crystalline semiconductor substrate, providing a phase change material in the trench, and providing a heater configured to heat the phase change material.

The above summary is merely intended to give a brief overview over some aspects of some embodiments and is not to be construed as limiting in any way.

BRIEF DESCRIPTION OF THE DRAWINGS

FIGS. 3A to 3C illustrate a switch device according to an embodiment, wherein

FIGS. 4A to 4C illustrate a switch device according to an embodiment, wherein

FIGS. 5A to 5C illustrate a switch device according to an embodiment, wherein

FIGS. 6A to 6C illustrate a switch device according to an embodiment, wherein

DETAILED DESCRIPTION

In the following, various embodiments will be described in detail referring to the attached drawings. The embodiments described hereinafter are to be taken as examples only and are not to be construed as limiting. For example, while in embodiments specific shapes and arrangements of components of a switch device like a phase change material or a heater are shown, in other embodiments other configurations may be used. For example, while in some embodiments a heater is provided above a phase change material, in other embodiments a heater may be provided below a phase change material.

Besides the features (for example components, elements, acts, events or the like) explicitly shown and described, in other embodiments additional features may be provided, for example features as used in conventional switch devices using phase change materials. For example, embodiments herein relate to switch devices where a phase change material is arranged at least partially within a trench formed in a substrate. Other components, like control circuitry for controlling a heater, radio frequency (RF) circuitry using the switch device and the like may be implemented in a conventional manner. Such additional components may be integrated with the described switch devices on the same substrate, but may also be provided separately for example on one or more separate chip dies, which in some implementations then may be combined with the switch device in a common package.

Functionally similar components in various figures bear the same references numerals, with the first digit corresponding to the number of the figure. Just to give an example, a heater is designated with reference numeral 16 in FIG. 1, with reference numeral 26 in FIG. 2, with reference numeral 56 in FIG. 3A, etc.

Therefore, these elements will not be described in detail repeatedly, but general explanations will be made when these elements occur for the first time (e.g. referring to FIG. 1), and for following Figures only differences to the previously described Figures will be described in detail. For example, materials for different components like heaters and phase change materials will be explained with reference to FIG. 1 and apply likewise to corresponding components of other embodiments.

Figure 1:
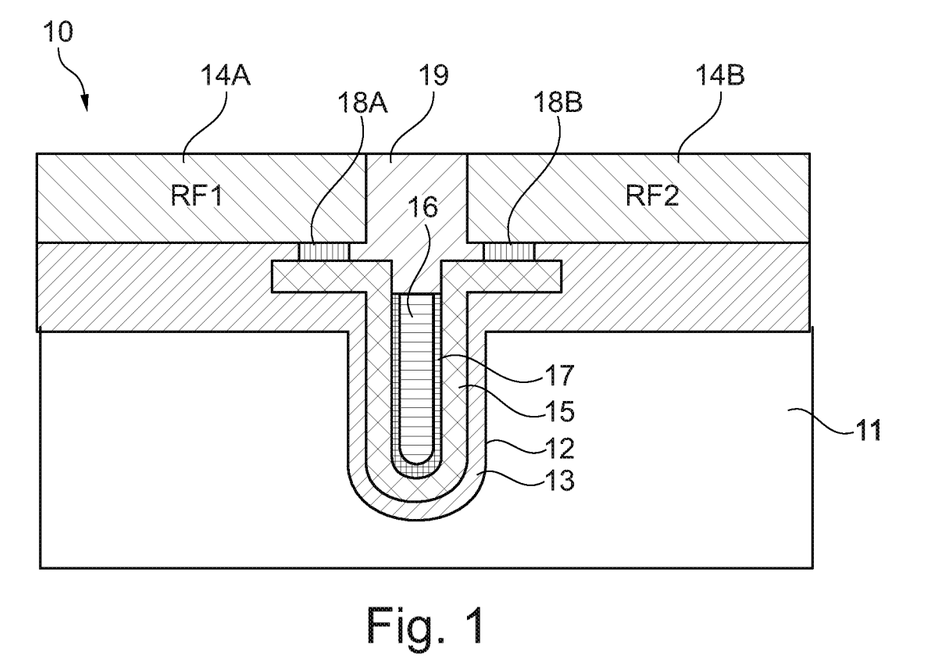
FIG. 1 is a cross-sectional view of a switch device according to an embodiment.

Turning now to the figures, FIG. 1. is a cross-sectional view of a switch device according to an embodiment.

Switch device 10 of FIG. 1 comprises a crystalline semiconductor substrate 11. Crystalline semiconductor substrate 11 as used herein means that the part of substrate 11 where the device shown is provided is made of a crystalline semiconductor material, for example silicon, gallium arsenide or silicon carbide. For example, crystalline semiconductor substrate 11 may be a semiconductor wafer like a silicon wafer. In other embodiments, semiconductor substrate 11 may include a crystalline semiconductor wafer with one or more crystalline semiconductor layers grown epitaxially thereon, for example a silicon semiconductor wafer with silicon layers epitaxially grown thereon (doped or undoped). In yet other embodiments, crystalline semiconductor substrate 11 may be an active layer of a semiconductor wafer having an insulation layer incorporated therein like an active wafer layer of a silicon-on-insulator (SOI) wafer. The active layer of such a wafer is the layer on which for example semiconductor devices are formed. Also such a substrate may further include crystalline epitaxial semiconductor layers formed on the layer. While a crystalline semiconductor substrate will be used as an example herein, in other embodiments other substrates, for example non-semiconductor crystalline substrates may be used, for example sapphire substrates. The term substrate, like crystalline (semiconductor) substrate, as used herein, does not include non-crystalline layers formed on a substrate like a semiconductor wafer, like dielectric layers, and also does not include metal layers. Such dielectric layers or metal layers may for example be formed in so-called back end of line (BEOL) processing. Crystalline semiconductor substrate 11 will be referred to simply as substrate in the following. The same applies to substrates used in further embodiments described further below.

In crystalline semiconductor substrate 11, a trench 12 is formed. A trench generally refers to a recess formed in the substrate. Such trenches may be formed by etching. In some embodiments, conventional techniques used for forming trenches in semiconductor substrates may be employed, for example techniques used for forming trenches used for shallow trench isolation (STI) or semiconductor devices built in trenches. In some implementations, the trench may have an elongated shape, which means that the trench is longer in a length direction than in a width direction, for example more than two times longer, more than three times longer, more than 10 times longer or even more than 100 times longer.

Compared to trenches used in conventional semiconductor devices, a ratio of the width of the trench to the depth of the trench may be comparatively large, also referred to as shallow trench. For example, an aspect ratio of width:depth (assuming that the width is smaller than the length) may be between 5:1 and 1:1, for example between 3:1 and 1.5:1, for example about 2:1. An aspect ratio of 2:1 may correspond to a cross-section in the width direction similar to a semicircle. Such shallow trenches in some implementations may lead to improved thermal properties compared to other trench geometries. However, in other implementations also deeper trenches with an aspect ratio width:depth smaller than 1:1 may be used. Such deeper trenches may reduce area requirements in some implementations. Generally, depth, length and width of the trench depend on the desired properties of the switch device. For example, for lower depth a larger width and/or length is needed to have a same area of phase change material (for example to have a same area than a specific conventional planar switch).

In trench 12, various elements may then be formed layer by layer. In the embodiment of FIG. 1, first, a thermal buffer layer 13 is provided, which may for example be made of silicon oxide or other dielectric materials. Following the thermal buffer layer, a phase change material (PCM) 15 is provided. An example for a usable phase change material is Germanium Telluride.

As can be seen in FIG. 1, the phase change material 15 is at least partially provided within trench 12. In some embodiments this may enhance cooling of PCM 15 in a reset operation due to enhanced thermal coupling to substrate 11, which serves as a heat sink.

In some embodiments, the shape of a side of PCM 15 facing trench 12 in at least one cross-section (for example the one shown in FIG. 1) matched or follows the shape of trench 12, such that PCM 15 is provided along the walls and bottom of trench 12, and separated from trench 12 by thermal buffer layer 13. This may help to achieve a desired cooling rate, which in some embodiments may be larger than $10^{10}$ K/s. As can be seen in FIG. 1, a side of PCM 15 facing trench 12 may have a curved portion, in this case at a bottom of trench 12, in at least one cross-section. This curved portion may further serve to enhance cooling. Yet, in other embodiments other shapes are possible, for example angular shapes.

Furthermore, a heater 16 is provided separated from PCM 15 by a barrier layer 17. Barrier layer 17 may for example be made of silicon nitride. Suitable heater materials for heater 16 include polycrystalline silicon or Tungsten. Heater 16 in the embodiment of FIG. 1 is also partially provided within trench 12. In the cross-section of FIG. 1, furthermore PCM 15 partially surrounds heater 16 (on three sides in case of FIG. 1). This may lead to an increased heat transfer from heater 16 to PCM 15 and may reduce heat dissipated to the environment, for example to a dielectric material 19 which in the example of FIG. 1 is used on top of substrate 11 as a filler material, for example for planarization purposes and/or as dielectric material in back end of line (BEOL) processes. Furthermore, the curved shape of PCM 15 already discussed above together with the surrounding facing heater 16 by PCM 15 leads to a greater outer surface of PCM 15 towards substrate 11 serving is a heat sink compared to a surface of heater 16. Therefore, a thermal resistance of the heater may be higher than in a planar design, even when a corresponding thermal resistance of PCM layer 15 is the same. This will be explained in more detail further below. Additionally, in some embodiments with this design the volume of heater 16 may be reduced compared to conventional solutions.

PCM 15 is coupled to contact pads 14A, 14B, which, for easier distinguishing from contact pads coupled to heater 16 described later on, are also labeled RF1 and RF2. Contact pads 14A, 14B may be provided in a metal layer of a conventional back end of line (BEOL) processing used in semiconductor manufacture, and connected to PCM 15 via vertical interconnects (e.g. VIA, vertical interconnect axis) 18A, 18B respectively. Contact pads 14A, 14B interconnects 28A, 28B and material 29 may be provided as in conventional BEOL processing in semiconductor technology. As briefly mentioned above, heater 16 may be also contacted to be able to supply electric power to heater 16. In operation of the switch device, by operating heater 16 PCM 15 may be brought to a crystalline phase state having a low-ohmic resistance or an amorphous phase state having a high-ohmic resistance, and therefore a low-ohmic connection between contact pads 14A, 14B may be selectively provided. This may for example be used as switch device for RF signals applied to contact pad 14A and/or 14B. It should be noted that contact pads 14A, 14B as well as contact pads for a heater (not described for FIG. 1, but described for other embodiments) need not be pads for external contacting, but may also be part of metal leads or wires extending to other parts of a circuit.

Figure 2:
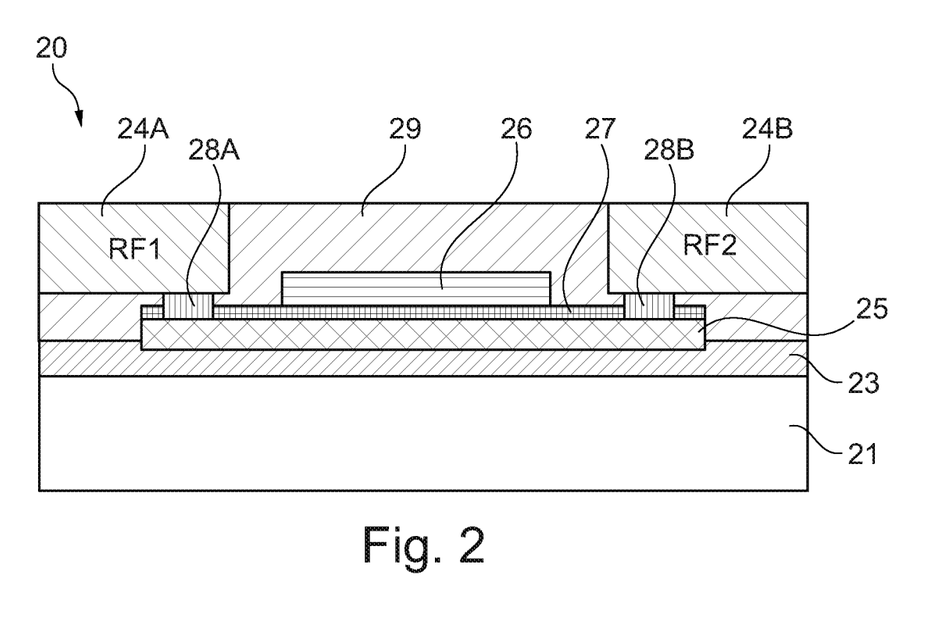
FIG. 2 is a cross-sectional view of a switch device according to a comparative example.

For better understanding of switch device 10 of FIG. 1, it will be compared to a reference switch device 20 of FIG. 2 using a conventional planar technology. FIG. 2 shows a cross-sectional view of switch device 20 which corresponds to the cross-sectional view of FIG. 1. In contrast to the embodiment of FIG. 1, in a substrate 21 no trench is provided, but a PCM 25 is provided on substrate 21 separated by a thermal buffer layer 23 in a planar manner. A heater 26 is provided on PCM 25 separated by a barrier layer 27 also in a planar manner. PCM 25 is contacted via contact pads 24A, 24B and vertical interconnects 28A, 28B as shown. A dielectric material 29 is used for planarization and isolation.

As can be seen in FIG. 2, when heating PCM 25, also filler material 29 has to be heated. Furthermore continuous thermal losses occur due to thermal losses via filler material 29. Furthermore, cooling with substrate 21 as a heatsink may be comparatively slow. As mentioned initially, cooling with a high cooling rate is required to bring the PCM to an amorphous phase state.

In contrast thereto, in FIG. 1 the placement of PCM 15 in trench 12, and the placement of heater 16 such that it is partially surrounded by PCM 15, essentially makes thermal losses to filler material or BEOL layers negligible, or reduces them significantly. It is to be understood that some losses may remain, but these are significantly smaller than in FIG. 2. This may reduce the power needed for heating PCM 15.

Furthermore, by the placement of PCM 15 in trench 12, thermal contact to the substrate 11 may be enhanced. This may contribute to a fast cooling of PCM 15 when resetting the switch device, i.e. putting PCM 15 to an amorphous phase state.

Various configurations for arranging a phase change material and a heater in a trench are possible. Some of these possible configurations will be explained now referring to FIGS. 3 to 6. Each of FIGS. 3 to 6 includes subfigures A, B and C, i.e. 3A, 3B, 3C for FIG. 3, 4A, 4B, 4C for FIG. 4 etc. Subfigures A show schematic top views on the substrate, and subfigures B and C show schematic cross-sectional views.

Figure 3A:
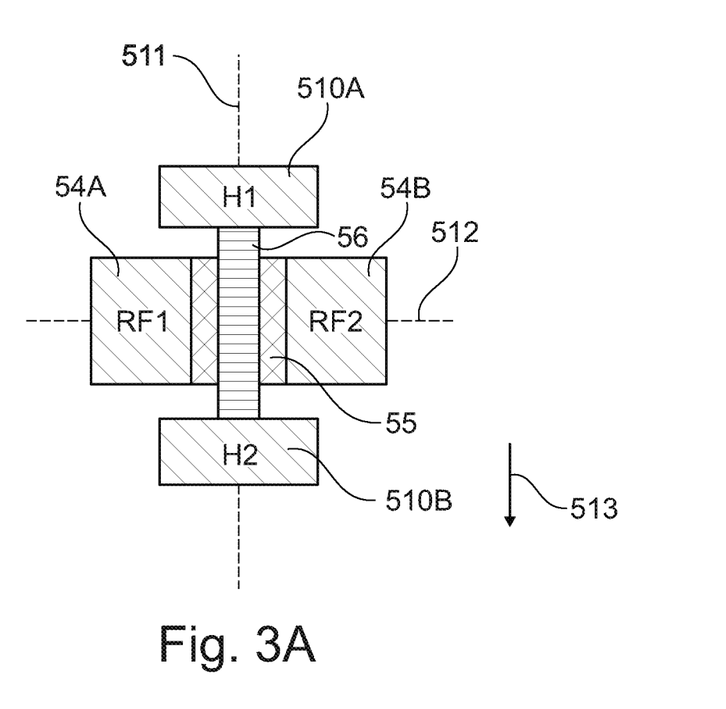
FIG. 3A is a schematic top view.
Figure 3B:
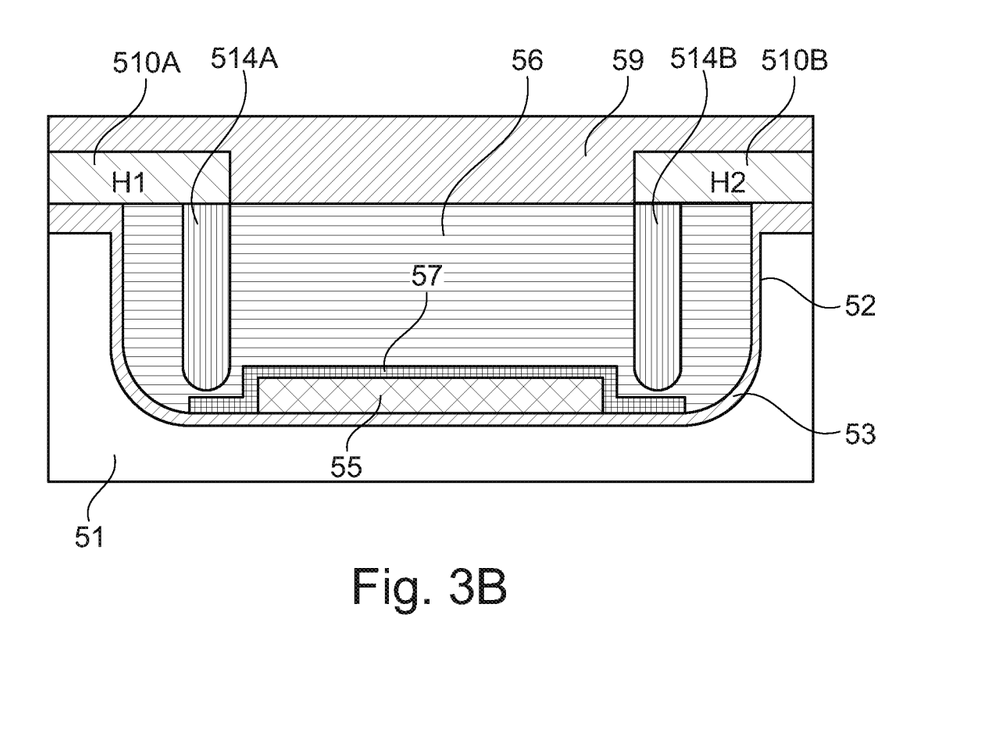
FIG. 3B is a schematic cross-sectional view along a line 511 in FIG. 3A.
Figure 3C:
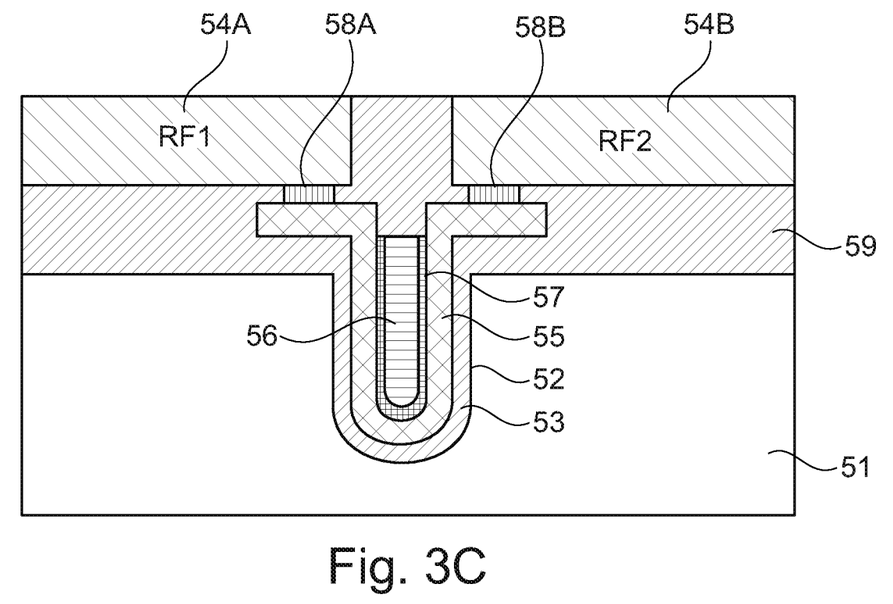
FIG. 3C is a schematic cross-sectional view along a line 512 in FIG. 3A.

FIG. 3A shows top view of a switch device according to an embodiment. FIG. 3B shows a schematic cross-sectional view along a dashed line 511, which is in the length direction of a trench 52. This length direction of the trench is also marked by an arrow 513. FIG. 3C shows a schematic cross-sectional view along a dashed line 512 in FIG. 3A, which runs in a width direction of trench 52. Generally, as explained previously, a length of the trench in the length direction may be larger than a width of the trench in a width direction.

In the embodiment of FIGS. 3A-3C, the cross-sectional view of FIG. 3C in this case essentially corresponds to switch device 10 discussed with reference to FIG. 1.

The switch device of FIGS. 3A-3C includes a crystalline semiconductor substrate 51, trench 52 formed in substrate 51, a thermal buffer layer 53, a phase change material 55, a barrier layer 57 and a heater 56.

In the embodiment of FIGS. 3A-3C, the phase change material is provided in the width direction of trench 52, and the heater is provided in the length direction of trench 52. This means, as seen in FIGS. 3A and 5C, that contact pads 54A, 54B for phase change material 52 are provided such that the signal flow through phase change material 55 is in the width direction. Contact pads 54A, 54B are provided in filler material 59 and coupled to phase change material 55 via vertical interconnects 58A, 58B.

For providing current to heater 56, contact pads 510A, 510B also labelled H1 and H2 are provided, which are electrically coupled to heater 56 by vertical contacts 514A, 514B, which, as seen in FIG. 3B, extend into heater 56 to provide a more uniform current distribution. Current through heater 5A, when present, therefore flows essentially in the length direction of the trench.

Figure 4A:
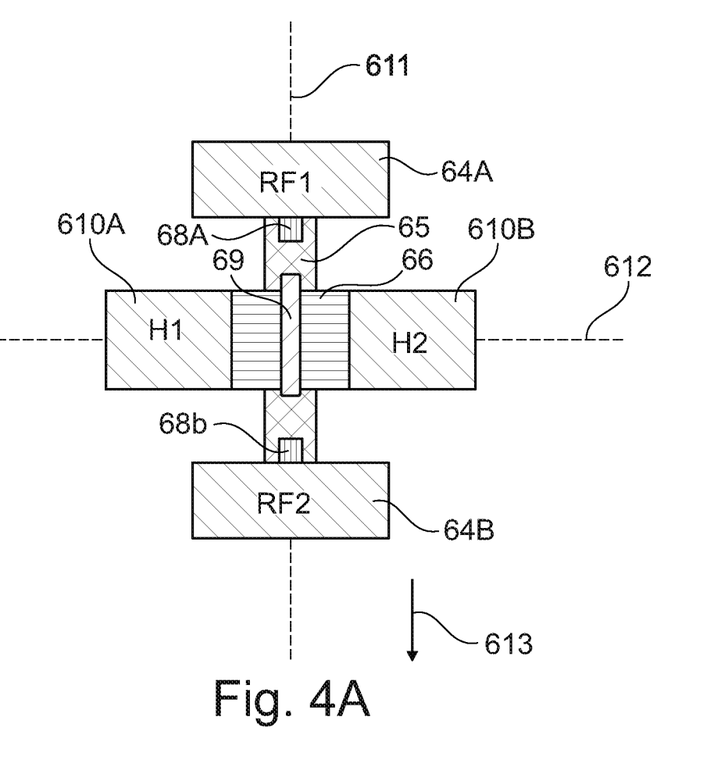
FIG. 4A is a schematic top view.
Figure 4B:
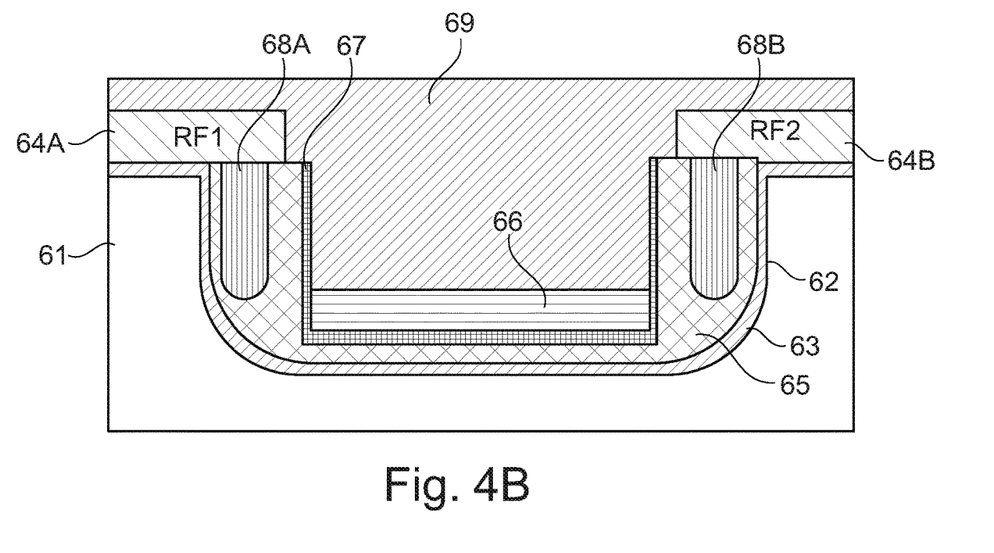
FIG. 4B is a schematic cross-sectional view along a line 611 in FIG. 4A.
Figure 4C:
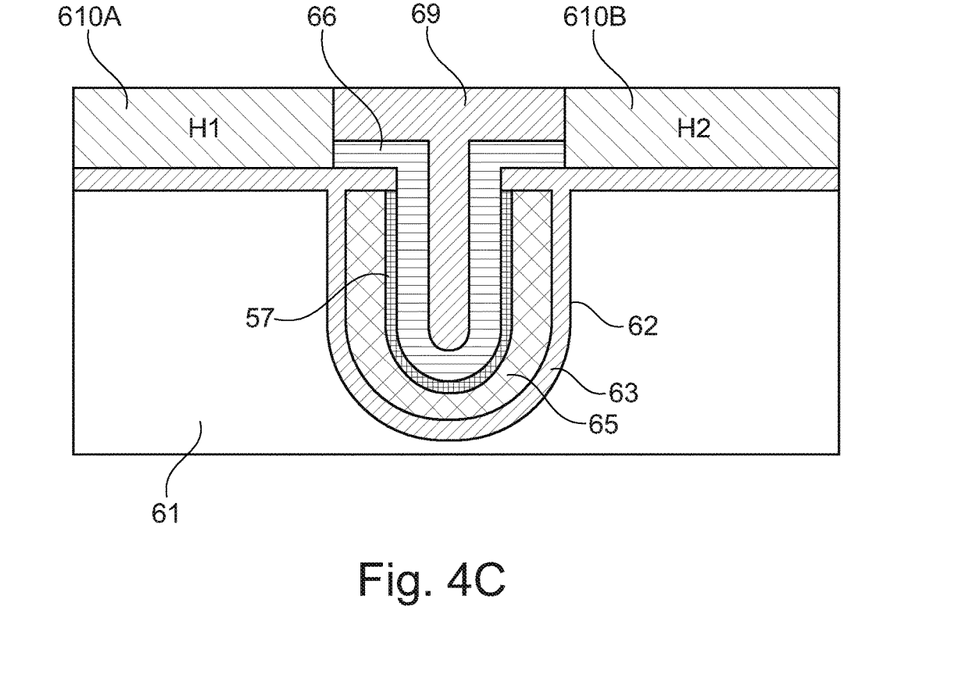
FIG. 4C is a schematic cross-sectional view along a line 612 in FIG. 4A.

FIGS. 4A-4C illustrates a further example configuration. FIG. 4A illustrates a top view of a switch device according to a further embodiment, FIG. 4B shows a schematic cross-sectional view along a dashed line 611, which runs in a length direction of a trench 62 as indicated by an arrow 613, and FIG. 4C shows a schematic cross-sectional view along a line 612 running in a width direction of trench 62.

In the embodiment of FIGS. 3A-3C, a depth of the trench may be about half a length of the trench.

The switch device of FIGS. 4A-4C includes a crystalline semiconductor substrate 61, trench 62 formed in substrate 61, a thermal buffer layer 63, a phase change material 65, a barrier layer 67 and a heater 66.

In the embodiment of FIGS. 4A-4C, phase change material 65 is arranged in the length direction, i.e. signal flow is in the length direction, and heater 66 is arranged in the width direction, i.e. current flow through heater 66, is in the width direction.

Figure 6A:
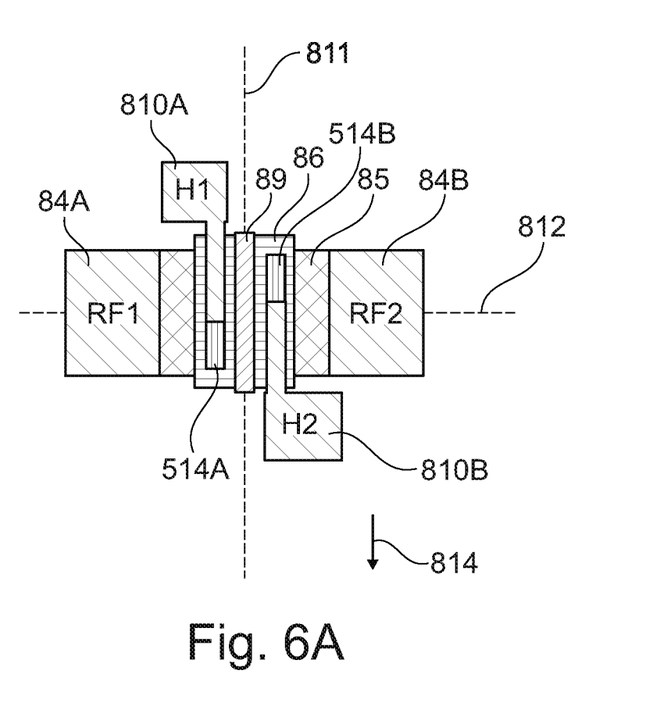
FIG. 6A is a schematic top view.
Figure 6B:
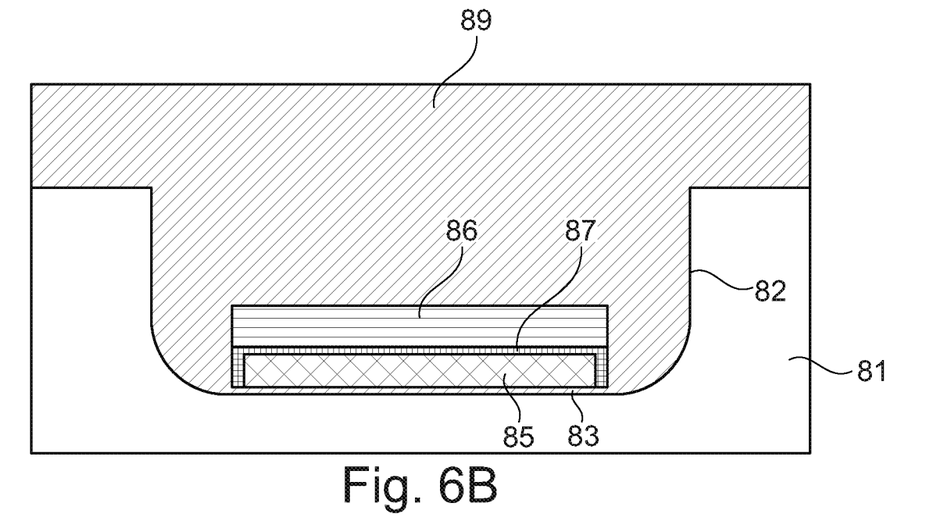
FIG. 6B is a schematic cross-sectional view along a line 811 in FIG. 6A.
Figure 6C:
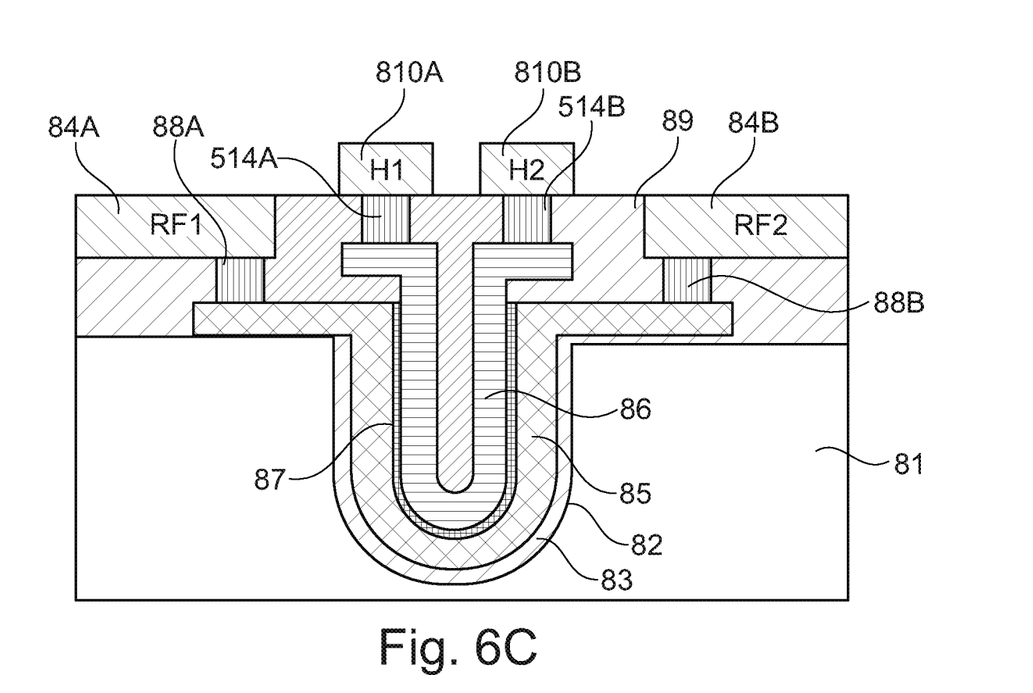
FIG. 6C is a schematic cross-sectional view along a line 812 in FIG. 6A.

As can be seen in FIGS. 4A and 6B, contact pads 64A, 64B for contacting phase change material 65 are provided such that current flows in the length direction. Contact pads 64A, 64B are coupled to phase change material 65 by vertical interconnects 68A, 68B which extend into the trench for better current distribution. Contact pads 610A, 610B for providing current through heater 66 are arranged in the width direction, as seen in FIGS. 6A and 6C. As seen in FIG. 4C, filler material 69 extends into the trench to provide a U shape of heater 66 in the cross-sectional view of FIG. 4C, to ensure that current flows through the heater essentially "along" phase shape material 65. Without this filler, material, i.e. if heater 66 had a filled-out U shape in FIG. 4C, current would mainly flow directly from contact pad 610A to contact pad 610B above substrate 61, such that the lower part of heater 66 would hardly be heated.

Figure 5A:
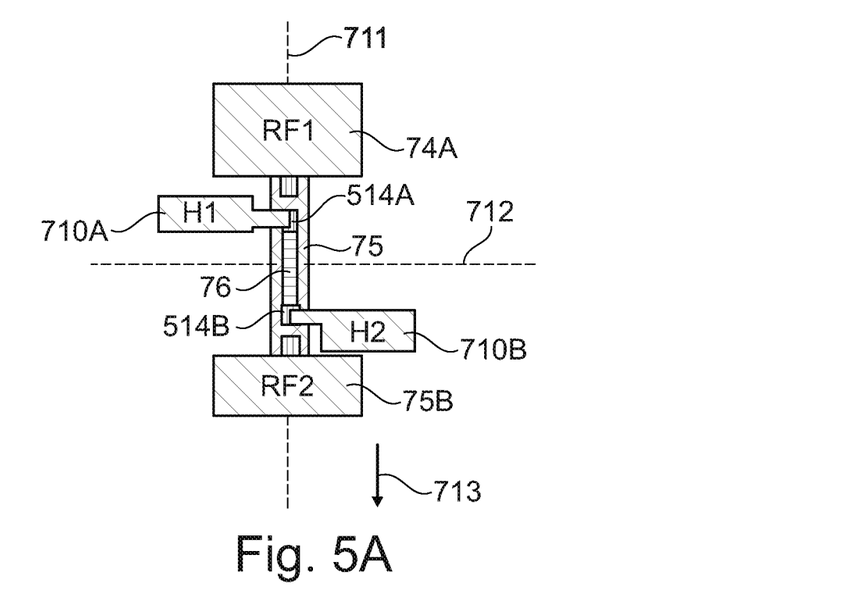
FIG. 5A is a schematic top view.
Figure 5B:
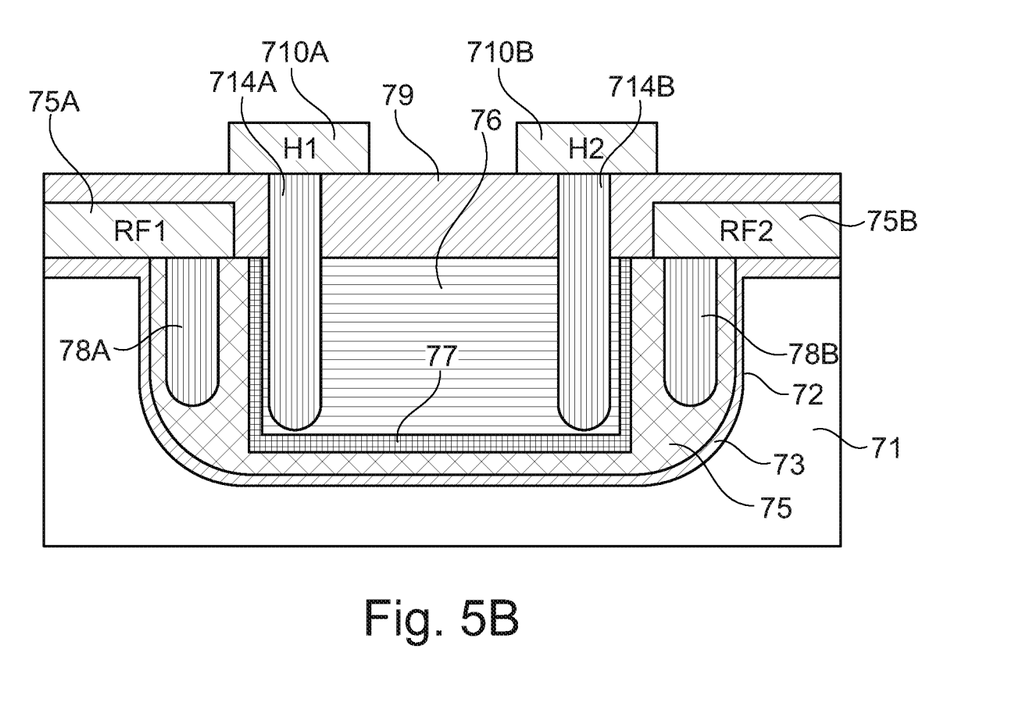
FIG. 5B is a schematic cross-sectional view along a line 711 in FIG. 5A.
Figure 5C:
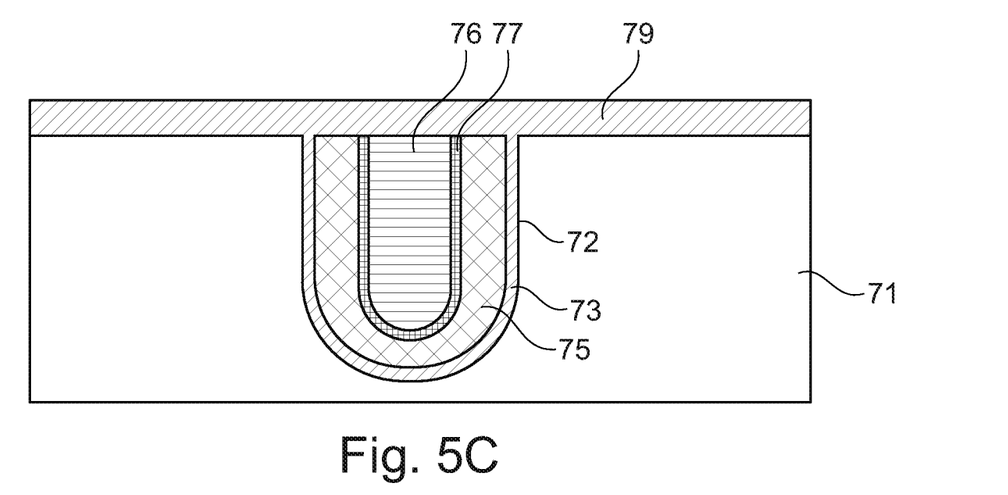
FIG. 5C is a schematic cross-sectional view along a line 712 in FIG. 5A.

FIGS. 5A-5C illustrates a switch device according to a further embodiment. FIG. 5A shows a top view, FIG. 5B shows a schematic cross-sectional view along a dashed line 711 running in a length direction of a trench 72 as indicated by an arrow 713, and FIG. 5C shows a schematic cross-sectional view along a dashed line 712 running in a width direction of trench 72.

The switch device of FIGS. 5A-5C includes a crystalline semiconductor substrate 71, trench 72 formed in substrate 71, a thermal buffer layer 73, a phase change material 75, a barrier layer 77 and a heater 76.

In the embodiment of FIGS. 5A-5C, both phase change material 75 and heater 76 are provided in a length direction, i.e. both signal flow through phase change material 75 and current flow through heater 76 are in the length direction. As, best seen in the cross-sectional view of FIG. 5B, contact pads 74A, 74B for contacting phase change material 75 and contact pads 710A, 710B for contacting heater 76 may be arranged in different metal layers. In other embodiments, an arrangement in a same metal layer may be used. As can be seen in the cross-sectional view of FIG. 5B, vertical interconnects 78A, 78B extend from contact pads 75A, 75B into phase change material 75, and vertical interconnects 714A, 714B extend from contact pads 710A, 710B into the heater 76, to ensure an appropriate current distribution.

FIGS. 6A-6C shows a switch device according to a further embodiment. FIG. 6A shows a top view, FIG. 6B shows s schematic cross-sectional view along a dashed line 811 running in a length direction of a trench 82 as indicated by an arrow 814, and FIG. 6C shows a schematic cross-sectional view along a dashed line 812 running in a width direction of trench 82.

The switch device of FIGS. 6A-6C includes a crystalline semiconductor substrate 81, trench 82 formed in substrate 81, a thermal buffer layer 83, a phase change material 85, a barrier layer 87 and a heater 86.

In the embodiment of FIGS. 6A-6C, both phase change material 85 and heater 86 are arranged in the width direction, i.e. signal flow through phase change material 85 and current flow through heater 86 is in the width direction. As can be best seen in FIGS. 8A and 8C, similar to the embodiment of FIGS. 5A-5C, contact pads 84A, 84B which contact phase change material 85, via vertical interconnects 88A, 88B and contacts pads 810A, 810B contacting heater 86 via vertical interconnects 514A, 514B may be arranged in different metal layers. In other embodiments, the may be arranged in the same metal layer. Furthermore, similar to FIG. 4, filler material 89 extends into the trench to provide a U form of heater 86 in the cross-section of FIG. 6C, similar to what was explained with reference to FIG. 4C.

As can be seen from FIGS. 5A to 8, various configurations of providing phase change material and heater in the trench and contacting them are possible. Therefore, it is evident that this disclosure is not limited to any specific configuration.

Figure 7:
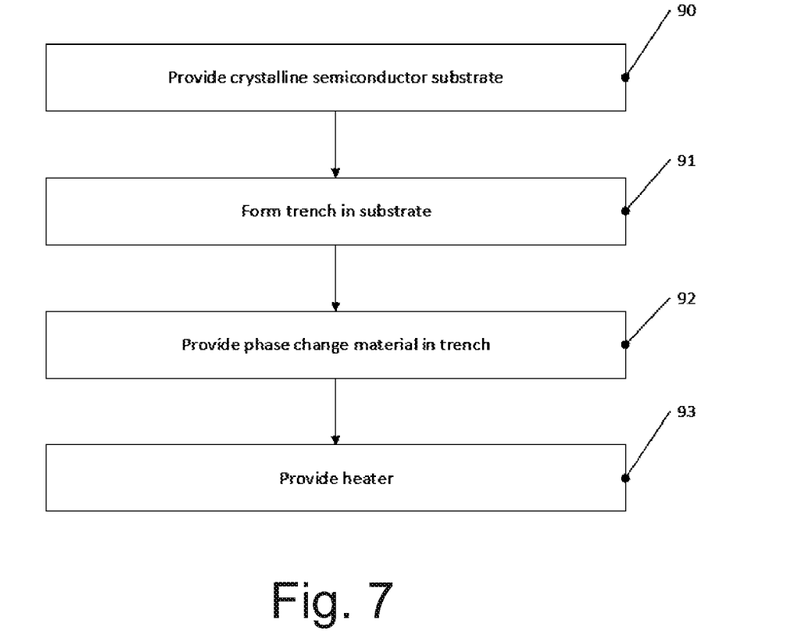
FIG. 7 is a flowchart illustrating a method for manufacturing a switch device according to some embodiments.

FIG. 7 is a flowchart illustrating a method of manufacturing a switch device according to some embodiments. The method of FIG. 7 may be used to manufacture any of the switch devices discussed previously, and in order to avoid repetitions, will be described referring to the previous explanations. However, it is to be understood that the method of FIG. 7 may also be used to manufacture other switch devices than the ones explicitly described previously.

At 90, the method comprises providing a crystalline semiconductor substrate, like substrates 11, 51, 61, 71 or 81 described previously.

At 91, the method comprises forming a trench in the substrate, for example by etching, like trench 12, 52, 62, 72 or 82 described previously.

At 92, the method comprises providing a phase change material in the trench, for example phase change material 15, 55, 65, 75 or 85 described previously. The phase change material may be provided partially in the trench, as also explained. For example at least 50%, at least 60%, at least 70% or at least 80% of the phase change material 75 may be provided in the trench.

At 93, the method comprises providing a heater, which also may be provided fully or partially within the trench, for example heater 16, 56, 66, 76 or 86 described previously.

Further process parts not explicitly shown and described in FIG. 7 may include contacting the phase change material or the heater, for example as shown and described with reference to FIGS. 5A to 8, providing a barrier material between phase change material and the heater (e.g. barrier layer 17) between 92 and 93, providing a thermal buffer between the phase change material and the substrate, or providing filler material, as also shown and described with reference to FIGS. 5 to 8.

Figure 8:
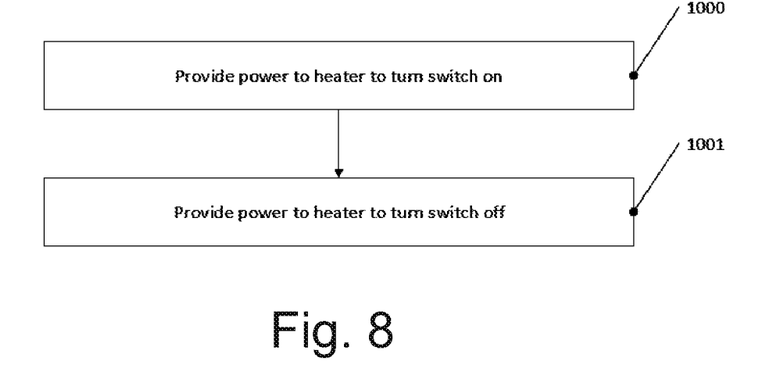
FIG. 8 is a flowchart illustrating a method for operating a switch device according to some embodiments.

FIG. 8 illustrates a method of operating a switch device, wherein the switch device is implemented using a trench in a crystalline semiconductor substrate as describe previously. Acts or events described with respect to FIG. 8 may be performed in different order and may be performed repeatedly to turn the switch on and off.

At 1000 the method comprises providing power to the heater to turn the switch on. In this case, the power is provided in a manner to perform the already described set operation, i.e. heat the phase change material to a temperature above the crystallization temperature and below the melt temperature.

AT 1001, the method comprises providing power to the heater to turn the switch off, i.e. here the power is provided in a manner as described for the reset operation above, that the temperature of the phase change material is raised above the melt temperature (for example above about 700° C.) followed by a fast cooling (for example larger than $10^{10}$ K/s) to turn the phase change material into an amorphous phase state.

Pulse length of power provided to the heater at 1000 or 1001 may be of the order of 1 µs or below.

With embodiments as discussed above, an increased cooling rate or a reduction of the energy needed for switching the switch up to 50% depending on the exact geometry used, may be obtained in some implementations.

Example 1. A switch device, comprising: a substrate, a trench formed in the substrate, a phase change material disposed at least partially in the trench, and a heater configured to heat the phase change material.

Example 2. The switch device of example 1, wherein the substrate is a crystalline semiconductor substrate.

Example 3. The switch device of example 1 or 2, wherein the heater is at least partially disposed in the trench.

Example 4. The switch device of any one of examples 1 to 3, wherein in at least one cross-section of the switch device, a form of a side of the phase change material facing the trench follows the shape of the trench.

Example 5. The switch device of any one of examples 1 to 4, wherein in at least one cross-section of the switch device, a side of the phase change material facing the trench has a curved portion.

Example 6. The switch device of example 4 or 5, wherein the at least one cross-section comprises a cross-section in a width direction, wherein the width direction of the trench has a width smaller than a length of the trench in a length direction.

Example 7. The switch device of any of examples 1 to 6, wherein the trench has a width, a length and a depth, wherein the width is smaller than the length and an aspect ratio width:depth is between 5:1 and 1:1.

Example 8. The switch device of any one of examples 1 to 7, wherein the phase change material surrounds the heater on at least two sides of the heater in at least one cross-section of the switch device.

The at least one cross-section in the preceding examples (e.g. examples 4, 5, 8) may be the same cross-section in all examples (e.g. a cross-section in the width direction as specified in example 5), but may also refer to different cross-sections in different examples (e.g. a cross-section in width direction in one example and a cross-section in length direction in another example).

Example 9. The switch device of any one of examples 1 to 8, further comprises a thermal buffer layer arranged between the phase change material and the trench.

Example 10. The switch device of any one of examples 1 to 9, wherein the switch device further comprises a barrier layer provided between the phase change material and the heater.

Example 11. The switch device of any one of examples 1 to 10, wherein the trench has a length direction having a length, a width direction having a width smaller than the length and a depth direction, wherein the device further comprises first contact pads configured to contact the phase change material, and second contact pads arranged to contact the heater.

Example 12. The switch device of example 11, wherein the first contact pads are arranged to provide signal flow through the phase change material in one of the length direction or the width direction, and the second contact pads are configured to provide current flow through the heater in the other one of the length direction or the width direction.

Example 13. The switch device of example 11, wherein the first contact pads are arranged to provide signal flow through the phase change material in one of the length direction or the width direction, and the second contact pads are arranged to provide current flow through the heater in the one of the length direction or the width direction.

Example 14. The switch device of any one of examples 11 to 13, wherein first vertical interconnects extend from the first contact pads to a part of the phase change material disposed in the trench.

Example 15. The switch device of any of examples 11 to 14, wherein second vertical interconnects extend from the second contact pads into a part of the heater disposed in the trench.

Example 16. A method for manufacturing a switch device, comprising: providing a substrate, forming a trench in the substrate, providing a phase change material in the trench, and providing a heater configured to heat the phase change material.

Example 17. The method of example 16, wherein the method is configured to manufacture the switch device of any one of examples 1 to 15.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A switch device, comprising:
   a substrate;
   a trench formed in the substrate;
   a phase change material disposed at least partially in the trench;
   a heater configured to heat the phase change material;
   first contact pads configured to contact the phase change material; and
   second contact pads arranged to contact the heater,
   wherein the trench has a length direction having a length, a width direction having a width smaller than the length and a depth direction.

2. The switch device of claim 1, wherein the heater is at least partially disposed in the trench.

3. The switch device of claim 1, wherein in at least one cross-section of the switch device, a form of a side of the phase change material facing the trench follows a shape of the trench.

4. The switch device of claim 1, wherein in at least one cross-section of the switch device, a side of the phase change material facing the trench has a curved portion.

5. The switch device of claim 1, wherein the trench has a width, a length and a depth, wherein the width is smaller than the length, and wherein an aspect ratio of width to depth for the trench is between 5:1 and 1:1.

6. The switch device of claim 1, wherein the phase change material surrounds the heater on at least two sides of the heater in at least one cross-section of the switch device.

7. The switch device of claim 1, further comprising a thermal buffer layer arranged between the phase change material and the trench.

8. The switch device of claim 1, further comprising a barrier layer between the phase change material and the heater.

9. The switch device of claim 1, wherein the first contact pads are arranged to provide signal flow through the phase change material in one of the length direction or the width direction, and wherein the second contact pads are configured to provide current flow through the heater in the other one of the length direction or the width direction.

10. The switch device of claim 1, wherein the first contact pads are arranged to provide signal flow through the phase change material in one of the length direction or the width direction, and wherein the second contact pads are arranged to provide current flow through the heater in the one of the length direction or the width direction.

11. The switch device of claim 1, further comprising vertical interconnects extending from the first contact pads to a part of the phase change material disposed in the trench.

12. The switch device of claim 1, further comprising vertical interconnects extending from the second contact pads into a part of the heater disposed in the trench.

13. A method for manufacturing a switch device, the method comprising:
   providing a substrate;
   forming a trench in the substrate;
   providing a phase change material in the trench;
   providing a heater configured to heat the phase change material;
   arranging first contact pads to contact the phase change material; and
   arranging second contact pads to contact the heater,
   wherein the trench has a length direction having a length, a width direction having a width smaller than the length and a depth direction.

14. The method of claim 13, further comprising:
   arranging a thermal buffer layer between the phase change material and the trench.

15. The method of claim 13, further comprising:
   forming a barrier layer between the phase change material and the heater.

16. The method of claim 13, further comprising:
   forming vertical interconnects that extend from the first contact pads to a part of the phase change material disposed in the trench.

17. The method of claim 13, further comprising:
   forming vertical interconnects that extend from the second contact pads into a part of the heater disposed in the trench.

18. A switch device, comprising:
a substrate;
a trench formed in the substrate;
a phase change material disposed at least partially in the trench;
a heater configured to heat the phase change material;
a thermal buffer layer arranged between the phase change material and the trench; and/or
a barrier layer between the phase change material and the heater.

19. A method for manufacturing a switch device, the method comprising:
providing a substrate;
forming a trench in the substrate;
providing a phase change material in the trench;
providing a heater configured to heat the phase change material;
arranging a thermal buffer layer between the phase change material and the trench; and/or
forming a barrier layer between the phase change material and the heater.

20. A switch device, comprising:
a substrate;
a trench formed in the substrate;
a phase change material disposed at least partially in the trench; and
a heater configured to heat the phase change material,
wherein the trench has a width, a length and a depth, wherein the width is smaller than the length, and wherein an aspect ratio of width to depth for the trench is between 5:1 and 1:1.

21. A switch device, comprising:
a substrate;
a trench formed in the substrate;
a phase change material disposed at least partially in the trench; and
a heater configured to heat the phase change material,
wherein the phase change material surrounds the heater on at least two sides of the heater in at least one cross-section of the switch device.

* * * * *